US006249227B1

(12) United States Patent
Brady et al.

(10) Patent No.: US 6,249,227 B1
(45) Date of Patent: Jun. 19, 2001

(54) RFID INTEGRATED IN ELECTRONIC ASSETS

(75) Inventors: Michael John Brady, Brewster; Paul W. Coteus; Dah-Weih Duan, both of Yorktown Heights; Venkata S. R. Kodukula, Peekstill; Paul Andrew Moskowitz, Yorktown Heights; Alejandro Gabriel Schrott; Robert Jacob Von Gutfeld, both of New York, all of NY (US); James Peter Ward, Raleigh, NC (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/185,858

(22) Filed: Nov. 4, 1998

Related U.S. Application Data
(60) Provisional application No. 60/070,444, filed on Jan. 5, 1998, and provisional application No. 60/103,304, filed on Oct. 6, 1998.

(51) Int. Cl.[7] .................................................... G08B 13/14
(52) U.S. Cl. .................................... 340/572.1; 340/572.5; 340/572.8
(58) Field of Search ........................... 340/572.1, 572.5, 340/572.8, 572.2, 551; 711/106; 361/392

(56) References Cited

U.S. PATENT DOCUMENTS

| | | |
|---|---|---|
| 4,075,632 | 2/1978 | Baldwin et al. . |
| 4,360,810 | 11/1982 | Landt . |
| 4,507,708 * | 3/1985 | Lindberg ............................. 361/392 |
| 4,782,345 | 11/1988 | Landt . |
| 4,786,907 | 11/1988 | Koelle . |
| 4,816,389 | 3/1989 | Sansonetti et al. . |
| 4,835,377 | 5/1989 | Brown . |
| 4,853,705 | 8/1989 | Landt . |
| 4,864,158 | 9/1989 | Koelle et al. . |
| 4,888,591 | 12/1989 | Landt et al. . |
| 4,999,636 | 3/1991 | Landt et al. . |
| 5,030,807 | 7/1991 | Landt et al. . |
| 5,055,659 | 10/1991 | Hendrick et al. . |
| 5,212,813 | 5/1993 | Renaud . |
| 5,450,087 | 9/1995 | Hurta et al. . |
| 5,479,160 | 12/1995 | Koelle . |
| 5,485,520 | 1/1996 | Chaum et al. . |
| 5,499,015 * | 3/1996 | Winkler et al. ................... 340/572.8 |

(List continued on next page.)

FOREIGN PATENT DOCUMENTS

| | | |
|---|---|---|
| 0 294 963 | 12/1988 | (EP) . |
| 0 505 905 | 9/1992 | (EP) . |
| 0 646 983 | 4/1995 | (EP) . |
| WO 97 20292 | 6/1997 | (WO) . |
| WO 97 24764 | 7/1997 | (WO) . |
| WO 98/16070 | 4/1998 | (WO) . |

OTHER PUBLICATIONS

"Multifunction Credit Card Package" IBM Technical Disclosure Bulletin, vol. 38, No. 08, Aug. 1995, p. 17.

"A Low–Power CMOS Integrated Circuit for Field–Powered Radio Frequency Identification Tag" By Friedman et al., 1997 IEEE International Solid State Circuits Conference, Paper SA 17.5, pp. 294, 295, 474.

*Primary Examiner*—Jeffery Hofsass
*Assistant Examiner*—John Tweel, Jr.
(74) *Attorney, Agent, or Firm*—O'Melveny & Myers LLP (57) ABSTRACT

Methods and apparatus applying RFID technology to identify electronic components, devices, and systems to provide functions such as, for example, security of the assets, inventory tracking of the assets, identification of the assets, and short distance communication between the assets are disclosed. RFID transponders are integrated into electronic components, devices and systems at the component level (i.e., circuit chip, circuit board, etc.), the asset level (i.e., box, computer, etc.), or system level (i.e., network system, computer system, etc.).

7 Claims, 8 Drawing Sheets

U.S. PATENT DOCUMENTS

| | | | |
|---|---|---|---|
| 5,504,485 | | 4/1996 | Landt et al. . |
| 5,510,795 | | 4/1996 | Koelle . |
| 5,521,601 | | 5/1996 | Kandlur et al. . |
| 5,528,222 | | 6/1996 | Moskowitz et al. . |
| 5,528,223 | * | 6/1996 | Dilonardo et al. .................... 340/551 |
| 5,538,803 | | 7/1996 | Gambino et al. . |
| 5,550,547 | | 8/1996 | Chan et al. . |
| 5,552,778 | | 9/1996 | Schrott et al. . |
| 5,554,974 | | 9/1996 | Brady et al. . |
| 5,563,583 | | 10/1996 | Brady et al. . |
| 5,565,847 | | 10/1996 | Gambino et al. . |
| 5,606,323 | | 2/1997 | Heinrich et al. . |
| 5,635,693 | | 6/1997 | Benson et al. . |
| 5,673,037 | | 9/1997 | Cesar et al. . |
| 5,680,106 | | 10/1997 | Schrott . |
| 5,682,143 | | 10/1997 | Brady et al. . |
| 5,708,419 | * | 1/1998 | Issacson et al. .................. 340/572.5 |
| 5,729,201 | | 3/1998 | Jahnes et al. . |
| 5,729,697 | | 3/1998 | Schkolnick et al. . |
| 5,736,929 | | 4/1998 | Schrott et al. . |
| 5,737,710 | | 4/1998 | Anthonyson . |
| 5,739,754 | | 4/1998 | Schrott et al. . |
| 5,767,789 | | 6/1998 | Afzali-Ardakani et al. . |
| 5,771,021 | | 6/1998 | Veghte et al. . |
| 5,777,553 | * | 7/1998 | Perreau et al. .................... 340/572.5 |
| 5,777,561 | | 7/1998 | Chieu et al. . |
| 5,787,174 | | 7/1998 | Tuttle . |
| 5,789,626 | | 7/1998 | Brady et al. . |
| 5,812,065 | | 9/1998 | Schrott et al. . |
| 5,821,859 | | 10/1998 | Schrott et al. . |
| 5,825,329 | | 10/1998 | Veghte et al. . |
| 5,826,328 | | 10/1998 | Brady et al. . |
| 5,828,318 | | 10/1998 | Cesar . |
| 5,828,693 | | 10/1998 | Mays et al. . |
| 5,831,532 | | 11/1998 | Gabino et al. . |
| 5,847,650 | * | 12/1998 | Zhou et al. ....................... 340/572.6 |
| 5,850,181 | | 12/1998 | Heinrich et al. . |
| 5,850,187 | | 12/1998 | Carrender et al. . |
| 5,874,902 | | 2/1999 | Heinrich et al. . |
| 5,890,199 | * | 3/1999 | Downs ................................. 711/106 |
| 5,949,335 | * | 9/1999 | Maynard .......................... 340/572.8 |
| 5,995,006 | * | 11/1999 | Walsh ............................... 340/572.7 |

* cited by examiner

FIG. 5B

RFID INTEGRATED IN ELECTRONIC ASSETS

CROSS-REFERENCE TO RELATED APPLICATIONS

The present application claims the benefit under 35 U.S.C. § 119 of U.S. Provisional Application No. 60/070,444, filed Jan. 5, 1998 and U.S. Provisional Application Serial No. 60/103,304, filed Oct. 6, 1998. Said U.S. Provisional Application No. 60/070,444 and U.S. Provisional Application Serial No. 60/103,304 are herein incorporated by reference in their entirety.

INCORPORATION BY REFERENCE

The following U.S. Patents and Patent Applications are hereby incorporated herein by reference in their entirety:

| U.S. Pat. Nos. | | | |
|---|---|---|---|
| U.S. Pat. No. | Issue Date | Filing Date | Attorney Docket No. |
| 5,521,601 | 05/28/96 | 04/21/95 | YO995-0088 |
| 5,528,222 | 06/18/96 | 09/09/94 | YO994-180 |
| 5,538,803 | 07/23/96 | 11/23/94 | YO994-0073 |
| 5,550,547 | 08/27/96 | 09/12/94 | YO994-185 |
| 5,552,778 | 09/03/96 | 11/23/94 | YO994-0232 |
| 5,554,974 | 09/10/96 | 11/23/94 | YO994-0071 |
| 5,563,583 | 10/08/96 | 11/23/94 | YO994-070 |
| 5,565,847 | 10/15/96 | 11/23/94 | YO994-0072 |
| 5,606,323 | 02/25/97 | 08/31/95 | YO995-157 |
| 5,635,693 | 06/03/97 | 02/02/95 | YO994-0215 |
| 5,673,037 | 09/30/97 | 09/09/94 | YO994-184 |
| 5,680,106 | 10/21/97 | 10/27/95 | YO995-0219 |
| 5,682,143 | 10/28/97 | 09/09/94 | YO994-170 |
| 5,729,201 | 03/17/98 | 06/29/95 | YO995-109 |
| 5,729,697 | 03/17/98 | 04/24/95 | YO995-076 |
| 5,736,929 | 04/07/98 | 06/07/96 | YO996-085 |
| 5,777,561 | 07/07/98 | 09/30/96 | YO996-178 |

| U.S. Nonprovisional patent applications Ser. Nos. | | |
|---|---|---|
| Application Ser. No. | Filing Date | Attorney Docket No. |
| 08/681,741 | 07/29/96 | YO996-037 |
| 08/660,249 | 06/07/96 | YO996-084 (allowed 4-28-98) |
| 08/621,784 | 03/25/96 | YO996-031 |
| 08/626,820 | 04/03/96 | YO995-158 |
| 08/646,539 | 05/08/96 | YO996-068 |
| 08/681,741 | 07/29/96 | YO996-037 |
| 08/694,606 | 08/09/96 | YO995-218 |
| 08/790,639 | 01/29/97 | YO997-024 |
| 08/790,640 | 01/29/97 | YO997-023 |
| 08/733,684 | 10/17/96 | YO996-195 |
| 08/862,149 | 05/23/97 | YO997-116 |
| 08/862,912 | 05/23/97 | YO997-115 |
| 08/862,913 | 05/23/97 | YO997-114 |
| 08/909,719 | 08/12/97 | YO995-109B (allowed) |
| 08/935,989 | 10/23/97 | YO997-310 |

| U.S. Provisional patent applications Ser. Nos. | | |
|---|---|---|
| Application Ser. No. | Filing Date | Attorney Docket No. |
| 60/073,102 | 01/30/98 | YO897-0028P1 |
| 60/074,605 | 02/13/98 | YO897-0259P1 |
| 60/077,879 | 03/13/98 | YO997-0038P1 |
| 60/078,287 | 03/17/98 | YO897-0661P1 |
| 60/078,304 | 03/17/98 | YO897-0662P1 |
| 60/091,350 | 07/01/98 | YO897-0259P2 |
| 60/093,088 | 07/16/98 | 38384P1 |

The following further documents are also incorporated herein by reference in their entirety:

IBM Technical Disclosure Bulletin

IBM Technical Disclosure Bulletin: Vol. 38 No. 08, August 1995, page 17, "Multifunction Credit Card Package," by Brady, Moskowitz, and Murphy (published anonymously).

Literature Reference

D. Friedman, H. Heinrich, D. Duan, "A low-power CMOS integrated circuit for field-powered radio frequency identification (RFID) tags," 1997 Digest of Technical Papers of the IEEE International Solid-State Circuits Conference (ISSCC), San Francisco, Calif., February 1997.

| PCT Published International applications Ser. Nos. | | |
|---|---|---|
| Application Ser. No. | Filing Date | Attorney Docket No. |
| PCT/GB96/00061 | 01/15/96 | UK 9-94-066 PCT |
| PCT/EP95/03703 | 10/20/95 | YO994-242 PCT |

| UK Published Application Ser. No. | | |
|---|---|---|
| Application Ser. No. | Filing Date | Attorney Docket No. |
| 9710025.9 | 05/19/97 | YO9-96-084 |

FIELD OF THE INVENTION

The present invention relates generally to radio frequency identification (RFID) systems, and more specifically to RFID tags integrated into electronic assets.

BACKGROUND OF THE INVENTION

Radio Frequency Identification (RFID) is becoming an important identification technology in applications such as inventory management, security access, personnel identification, factory automation, automotive toll debiting, and vehicle identification to name just a few. RFID systems utilize an RFID transmitter-receiver unit (usually referred to as a base station or interrogator) to query an RFID transponder or tag which may be located at a distance from the transmitter-receiver unit. The RFID tag detects the interrogating signal and transmits a response signal containing encoded data back to the receiver.

RFID systems provide identification functions not found in identification technologies such as optical indicia (e.g., bar code) recognition systems. For example, RFID systems may employ RFID tags containing read/write memory of several kilobytes or more. The RFID tags may be readable at a distance and do not require direct line-of-sight view by the reading apparatus (e.g., base station or interrogator). Further, several such RFID tags may be read by the RFID system at one time.

Manufacturers and users of assets such as electronic components, devices, and systems have a need for an efficient means of tracking information about these assets in order to, for example, verify ownership, provide warranty information, prevent counterfeiting of parts, and provide theft recovery. Presently, such information is tracked by placing a serial number on the asset and storing this serial number along with information about the asset in a large, centralized database, typically the database of the manufacturing entity. However, due to the often large size of such a database or a use's inability to efficiently access the database, essential information such as identification (i.e., serial number) for inventory tracking or theft recovery, servicing information (i.e., time of assembly and/or sale, date of last service, date when next service is due, etc) and the like may be difficult to access and track.

Consequently, it would be desirable to apply RFID technology to electronically store information about an asset such as an electronic component, device, or system within the asset in order to provide functions such as, for example, assuring security of the assets, inventory tracking of the assets, identification of the assets, and short distance communication between the assets.

SUMMARY OF THE INVENTION

Accordingly, the present invention employs RFID technology to store and provide information about assets such as electronic components, devices, and systems in order to provide functions such as, for example, assuring security of the assets, inventory tracking of the assets, identification of the assets, and short distance communication between the assets. The present invention may be applied at the component level (i.e., circuit chip, circuit board, drive, motherboard, etc.), the device level (i.e., box, computer, monitor, server, etc.), or the system level (i.e., network system, computer system, etc.).

In accordance with a first aspect of the present invention, RFID technology is applied at the chip level. An electronic component such as a packaged integrated circuit (IC) includes an integrated RF transponder for communicating information about the component to an RFID system. The packaged IC comprises a package having a plurality of external leads or pins electrically coupled to one or more integrated circuits contained therein. One or more host or primary integrated circuit chips are housed within the package and electrically coupled to the leads as necessary. A radio frequency integrated circuit (RFID IC) comprising memory for storing information about the electronic component and an RF transmitter and receiver section for communicating the information to the RFID system is housed within the package. The RF transmitter and receiver section may operate by modulating a reflected RF signal. The RFID IC may be a separate chip housed within the package and electrically coupled to at least one of the leads (for connection of an antenna) of the package, or alternatively, may be integrated monolithically with the primary IC.

The present invention may similarly be applied at the circuit board level. An electronic component comprising a circuit board may include an integrated RF transponder for communicating information about the component to an RFID system. The circuit board comprises a substrate having mounted thereon one or more packaged IC's operable to provide the functions of the component. An RF transponder circuit is mounted to the substrate. The RF transponder circuit includes memory for storing information about the electronic component and an RF transmitter and receiver section for communicating the information to the RFID system. The RF transponder circuit may be a packaged IC mounted to the substrate and coupled to an antenna formed on the substrate, or to an externally supplied antenna, pluggable antenna, detachable antenna, etc. via a connector. Alternatively, one or more of the IC's mounted to the substrate may include an integrated RFID IC. Each of these RFID IC's may be coupled to a separate antenna or may be coupled to and share a common antenna via a switching circuit.

According to a further aspect of the present invention, RFID technology is applied at the device level. An electronic device includes electronic components (i.e., a circuit board, a motherboard, a disc drive, etc.) configured to provide a function of the electronic device and an RF transponder. The RF transponder may be mounted to the electronic component or to the device's housing. The RF transponder includes memory forstoring information about the electronic device and an RF transmitter and receiver section for providing communication of the information with the RFID system. The RF transponder may be programmed with information about the device and/or, optionally, components within the device.

In accordance with yet another aspect of the present invention, RFID technology is applied to the system level to provide an information handling system capable of communicating information to an RFID system. The information handling system includes a plurality of electronic devices each configured to provide one or more of the functions of the information handling system. An RF transponder is provided by at least one of said electronic devices. The RF transponder includes memory for storing information about the information handling system, an RF transmitter and receiver section for providing communication of the information with the RFID system, and an antenna coupled to the RF transmitter and receiver section. The RF transponder may then be programmed with information about the system, devices within the system, and components within each device of the system.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 2A depicts a host integrated circuit (IC) chip and radio frequency identification integrated circuit (RFID IC) chip packaged together in a plastic-molded package;

FIG. 2B depicts an integrated circuit (IC) chip which includes a radio frequency identification (RFID) circuit integrated monolithically therein wherein the IC is packaged in a plastic-molded package;

FIG. 3A depicts a printed circuit board comprising an RF transponder including an RFID IC and an antenna which is formed as an integral part of the circuit board;

FIG. 3B depicts a printed circuit board comprising an RF transponder including an RFID IC mounted thereon and interconnected to an externally provided antenna via a circuit board mounted coupling device;

FIG. 3C depicts a printed circuit board comprising an RF transponder including an RFID IC and an antenna which is formed as an integral part of the circuit board, wherein the RFID IC is inter-connected with electronic elements and circuits mounted on the circuit board;

FIG. 3D depicts a printed circuit board including multiple integrated circuits having integral RFID IC's;

FIG. 4A depicts an electronic device comprising a plurality of electronic components (i.e., circuit boards) wherein one or more of the components includes an integral RFID transponder;

FIG. 4B depicts an electronic device having a single RF transponder mounted therein;

FIG. 4C depicts an electronic device having a primary circuit board or "motherboard" which comprises an integral RF transponder including an RFID IC and an antenna integrally formed on the motherboard;

FIG. 4D depicts an electronic device having a primary circuit board or "motherboard" wherein the RF front-end section and antenna of the RF transponder are mounted on the device's housing while the remaining RFID circuits are mounted on the motherboard;

FIG. 4E depicts an electronic device comprising a primary circuit board or "motherboard" and RF transponder including an RFID IC mounted to the motherboard and coupled to an externally provided antenna via a connector;

FIG. 5A depicts a system wherein each electronic device includes at least one RF transponder mounted thereto; and FIG. 5B depicts a system utilizing a single system level RF transponder.

DETAILED DESCRIPTION OF THE INVENTION

Reference will now be made in detail to the presently preferred embodiment of the invention, an example of which is illustrated in the accompanying drawings.

Figure 1:
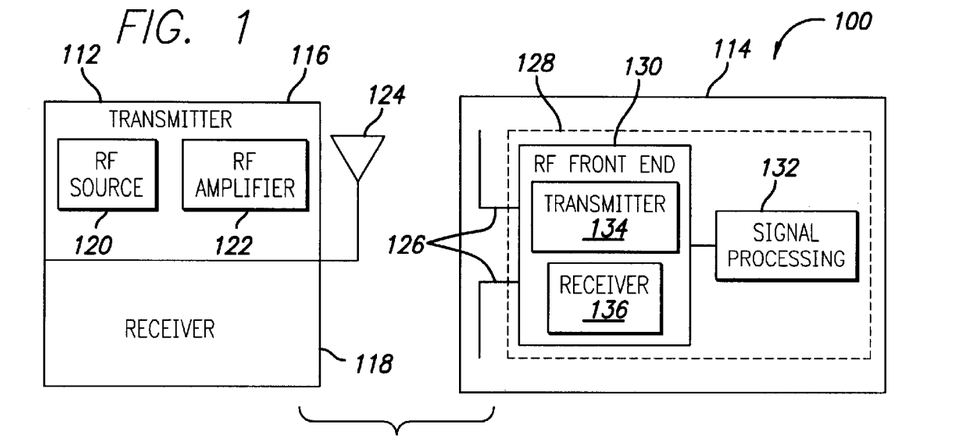
FIG. 1 is a block diagram depicting of a typical radio frequency identification (RFID) system.

Referring now to FIG. 1, a typical RFID system is shown. The RFID system 100 includes an interrogator or base station 112 communicating an RF signal to an RFID transponder 114. The interrogator 112 preferably includes RF transmitter and a receiver sections 116 & 118 for providing two way communication with the RFID transponder 114. The transmitter section 116 preferably includes an RF source 120 and RF amplifier 122 which send RF power to an antenna 124. The transmitter section 116 transmits an RF signal with a transmitter carrier frequency. The transmitter carrier also has a transmitting carrier frequency bandwidth referred to as a transmitting bandwidth. The transmitting bandwidth is preferably wide enough to transmit data at a desired rate.

The RFID transponder 114 comprises an antenna 126 and an RFID circuit 128 including an RF processing section (typically referred to as a front end) 130 and a signal processing section 132. The front end 130 can be any known front end design used with an antenna. The front end 130 may include a transmitter 134 and a receiver 136. Examples of front ends are well known. See, for example, the Hewlett Packard "Communications Components GaAs & Silicon Products Designees Catalog" (i.e., page 2–15) which is herein incorporated by reference in its entirety. A typical front end is also described in U.S. patent application Ser. No. 08/790,639 to Duan, et al. filed Jan. 29, 1997 which is herein incorporated by reference in its entirety. The signal processing section 132 may include logic circuits and memory for processing and storing information.

The present invention employs RFID technology to store and provide information about assets such as electronic components, devices, and systems. In this manner, functions such as, for example, security of the assets, inventory tracking of the assets, identification of the assets, and short distance communication between the assets. The present invention may be applied at the component level (i.e., circuit chip, circuit board, drive, motherboard, etc.), the device level (i.e., box, computer, monitor, server, etc.), or the system level (i.e., network system, computer system, etc.).

Figure 2A:
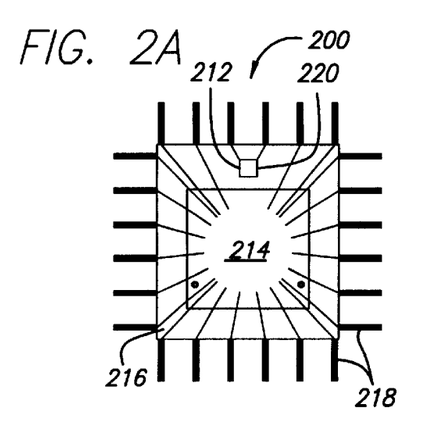
FIGS. 2A and 2B are top plan views illustrating the application of the present invention at the chip level.
Figure 2B:
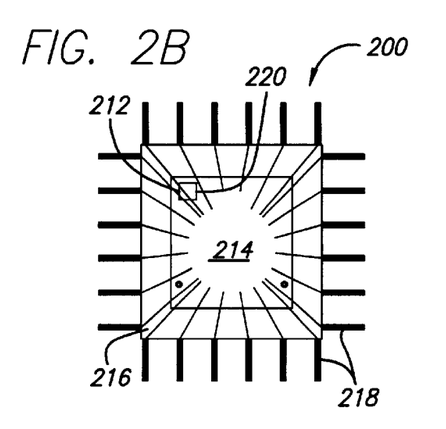

Referring now to FIGS. 2A and 2B, application of the present invention at the chip level is shown. A packaged integrated circuit (IC) 200 includes an integrated RFID circuit 212 for communicating information about the IC 200 to an RFID system (such as the RFID system shown in FIG. 1). The packaged IC 200 preferably comprises a host IC chip (i.e., a micro-processor, a micro-controller, a video codec, a memory device, etc.) 214 encapsulated within a plastic-molded package 216. The package 216 may be a single in-line package (SIP), dual in-line package, or flat pack (shown). The preferred package is determined mostly by the host IC 214. Typical IC packages include, but are not limited to SOP, MSOP, SOIC, PBGA, TQFP, LQFP, MQFP, PQFP, PLCC, TSSOP, SSOP, QSOP, MICRO, PDIP, and POWER packages. Preferably, the package 216 includes a plurality of external leads or pins 218 which are electrically coupled as required by the IC design to the host IC chip 214 via conventional techniques such as wire bonding or the like.

As shown in FIG. 2A, the RFID circuit 212 may be a radio frequency identification integrated circuit (RFID IC) 220. The RFID IC 220 preferably comprises an RF processing section (e.g., a front end) and a signal processing section including logic circuits and memory for storing information about the packaged IC 200. In this manner, information may be transmitted to the RFID IC 220 where it is written to the memory and stored. When the RFID IC 220 is later interrogated by the RFID system, the stored information may be recalled from memory to be read by the interrogator or base station (see FIG. 1).

The RFID IC 220 may be a separate chip, as shown in FIG. 2A, which is encapsulated within the package 216 adjacent to the host IC chip 214 to form a multi-chip module. The RFID IC 220 may be electrically coupled to at least one of the leads 218 of the package 216 (e.g., for connection to an antenna, a power source, etc.). Preferably, the RFID IC 220 is electrically coupled to the host IC chip 214 via conventional techniques such as wire bonding. This allows the RFID IC 220 to communicate information directly with, and to receive electrical power via the host IC chip 214. The RFID IC 220 may alternately operate separately from the host IC 214 (e.g., the RFID IC 220 is not electrically coupled to the host IC chip 214). One or more leads 218 may to which the RFID IC 220 is connected, may couple the front end of the RFID IC to an externally provided antenna (see FIG. 3A). Alternatively, an antenna may be formed in the host IC chip 214, package 216, or RFID IC 220.

As shown in FIG. 2B, the RFID circuit 212 may alternatively be integrated monolithically within the host IC chip 214. One or more leads 218 to which the host IC chip 212 is connected, may be dedicated to coupling the RFID circuit 212 to an externally provided antenna (see FIG. 3A). Alternatively, an antenna may be formed in the host IC chip 214 or the package 216.

The RFID equipped packaged IC 200 may provide functions such as, for example, assuring security of the assets, inventory tracking of the assets, identification of the assets, and short distance communication between the assets. For example, the host IC chip 214 of the packaged IC 200 may be a microprocessor of a personal computer system. Such a microprocessor, if it possesses desirable characteristics (i.e., high speed, efficient design, etc.) and is in limited supply, may be highly desirable and subject to theft. An RFID system (see FIG. 1) may be utilized to prevent removal of the microprocessor from the premises (i.e., factory, warehouse, office, etc.) where it is stored, or used. For example, an office employing a large number of advanced computer systems equipped with the described microprocessor may utilize interrogators located near exits to warn if a microprocessor is being removed. Similarly, the microprocessor may be designed so that it will not function properly unless it is enabled or "activated" in the manufacturer's facility. In an exemplary embodiment, the microprocessor may be activated by a base station which transmits an "unlock" command to the RFID circuit 212. The unlock command may flip the state of a locklunlock bit within the microprocessor or the RFID IC which controls the activities of other circuits within the microprocessor. Alternatively, sophisticated keyed encryption architectures may be used to secure the transactions between the authorizing base station and the RFID IC.

Referring now to FIGS. 3A through 3D, application of the present invention at the circuit board level is shown. An electronic component (i.e., an expansion board for a computer, a disk drive, a hard disk drive, etc) may comprise a printed circuit board 300 containing an integrated RFID transponder 312 for communicating information about the electronic component to the RFID system (see FIG. 1). The circuit board 300 preferably includes a substrate 314 formed from a phenolic, epoxy, or similar dielectric material, on which electrical and electronic elements (i.e. integrated circuits (IC), transistors, resistors, capacitors, etc.) 316 are mounted in the construction of a circuit. The circuit board 300 may have an etched copper foil pattern 318 on one (single sided), both sides (double sided), and/or between layers of dielectric material of the substrate 314 for the purpose of interconnection of elements 316 mounted to the substrate 314.

Figure 3A:
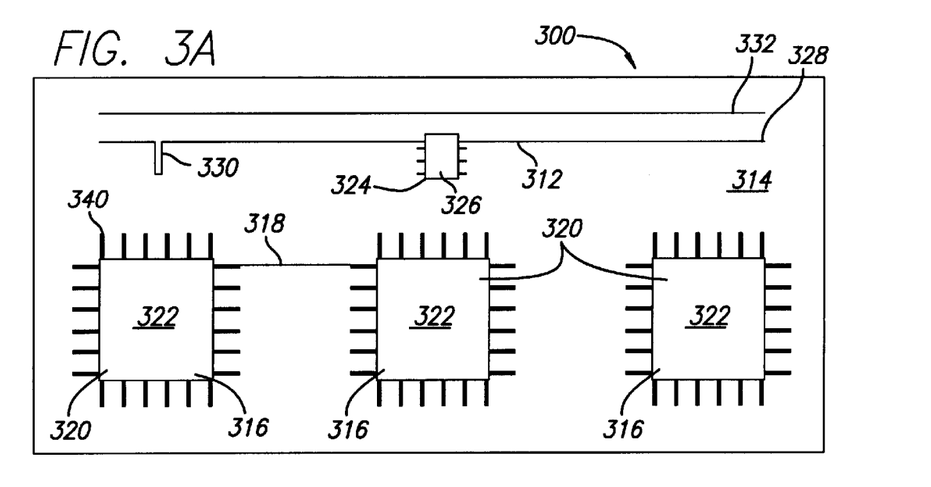
FIGS. 3A, 3B, 3C, and 3D are top plan views illustrating the application of the present invention at the component (i.e., circuit board) level.

Electronic elements 316 mounted on the circuit board 300 may include one or more packaged integrated circuits (IC) 320. As described, supra, in connection with the description of FIGS. 2A and 2B, each packaged IC 320 preferably comprises at least one IC chip (i.e., a micro-processor, a micro-controller, a video codec, a memory device, etc.) encapsulated within a plastic-molded package 322. The package 322 may be a single in-line package (SIP), dual in-line package, or preferably a flat pack (shown). Typical flat pack IC packages which may be utilized by the present invention include, but are not limited to SOP, MSOP, SOIC, PBGA, TQFP, LQFP, MQFP, PQFP, PLCC, TSSOP, SSOP, QSOP, MICRO, PDIP, and POWER packages. Preferably, the package 322 includes a plurality of external leads or pins 340 which electrically couple the packaged IC 320 to the copper foil pattern 318.

Figure 3B:
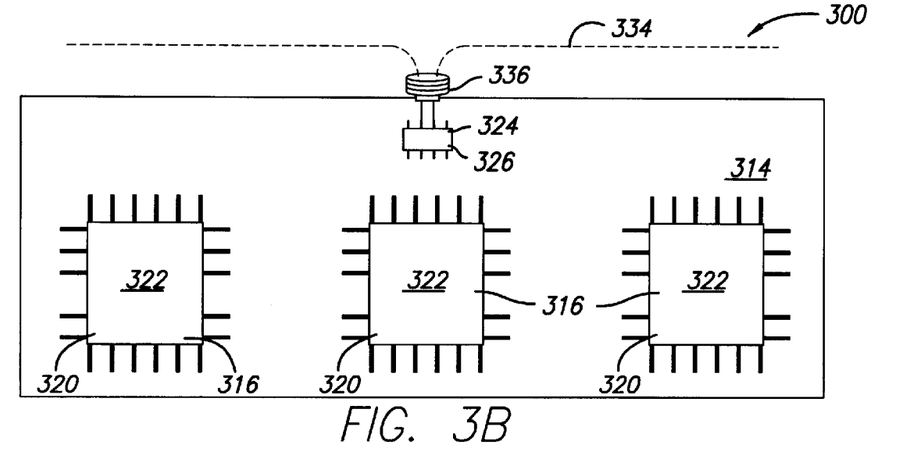
Figure 3C:
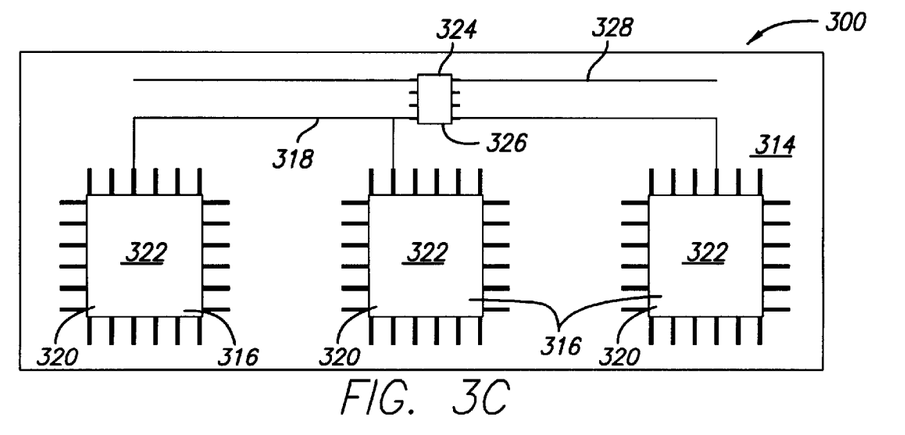

As shown in FIGS. 3A, 3B, and 3C, the RFID transponder 312 preferably includes a packaged radio frequency identification integrated circuit (RFID IC) 324 mounted to the substrate 314 of the circuit board 300. The package 326 of the RFID IC 324 may be a single in-line package (SIP), dual in-line package, or preferably a flat pack (shown). Typical, packages which may be utilized by the present invention include, but are not limited to SOC, MSOP, SOIC, PBGA, TQFP, LQFP, MQFP, PQFP, PLCC, TSSOP, SSOP, QSOP, MICRO, PDIP, and POWER packages. The RFID IC 324 comprises an RF processing section (e.g., a front end) and a signal processing section including logic circuits and memory for storing information about the electronic component. In this manner, information may be transmitted to the RFID transponder 312 where it is written to the memory of the RFID IC 324 and stored. When the RFID transponder 312 is later interrogated by the RFID system, the stored information may be recalled from memory to be read by the interrogator or base station (see FIG. 1).

As shown in FIGS. 3A and 3C, the RFID IC 324 may be interconnected with an antenna 328 integrally formed on the substrate 314 of the circuit board 300. Preferably, the antenna 328 comprises thin, typically 18 to 35 micron thick, lines formed of a conductive metal such as copper. These lines may be formed by plating, adhering orscreening a thin layerofcopper(orotherconductive metal) onto to the substrate 314. This layer may then be etched to form the specific geometric configuration (i.e., monopole, dipole, folded dipole, meander dipole, patch, slot, loop, spiral, etc.) of the antenna 328. One or more impedance adjustment elements 330 & 332 may be integrally formed on the substrate 314 to modify the impedance of the antenna 328. The impedance adjustment elements 330 & 332 may be lumped circuit elements, distributed microwave circuit elements, or parasitic elements that are electromagnetically coupled to the antenna (i.e., not electrically connected). For example, the antenna 328 may include a tuning stub 330 having a length and width adjusted to tune the impedance of the antenna 328. The tuning stub 330 acts as a two conductor transmission line and may be terminated either in a short-circuit or open-circuit. A short circuited stub acts as a lumped inductor while an open-circuit stub acts as a lumped capacitor. The magnitude of the reactance of the stub is affected by the stub's length, width, and spacing. Similarly, one or more impedance loading bars 332 may be positioned on the substrate 314 adjacent to the antenna 328. Use of impedance adjustment elements such as tuning stubs and impedance loading bars to adjust the impedance of an antenna is described in detail in U.S. patent application Ser. No. 08/790,639 to Duan, et al. filed Jan. 29, 1997 which is herein incorporated by reference in its entirety.

As shown in FIG. 3B, the RFID IC 324 may alternatively be mounted to the substrate 314 and coupled to a detachable externally provided antenna 334 via a coupling device or connector 336. The externally provided antenna 328 may, for example, be formed on another circuit card, mounted to a device containing the circuit card 300 holding the RF transponder 312, or remotely located (i.e., attached to the roof of a building housing an electronic device containing the circuit card 300). Preferably, the coupling device 336 is also mounted to the substrate 314.

As shown in FIG. 3C, the RFID IC 324 may be electrically interconnected to other electronic elements or circuits 316 mounted to the circuit board 300. When the RFID IC 324 is not inter-connected to other electronic elements or circuits 316 (as shown in FIG. 3A), it will typically contain only a unique identification number and perhaps some information about the circuit board 300 being identified. However, when the RFID IC 324 is inter-connected one or more electronic elements 316, it may provide additional functions such as identification of electronic elements 316 mounted to the circuit board 300. For example, two or more versions of a processor may be mounted to the same type of circuit board. An RFID IC mounted to the circuit board and interconnected with the processor may receive information, from the processor identifying which version it is, via the interconnection. The RFID IC may then transmit this information to the RFID system in real time via, for example, a base station to identify the version of the processor mounted on the board during the inventory or assembly processes.

Figure 3D:
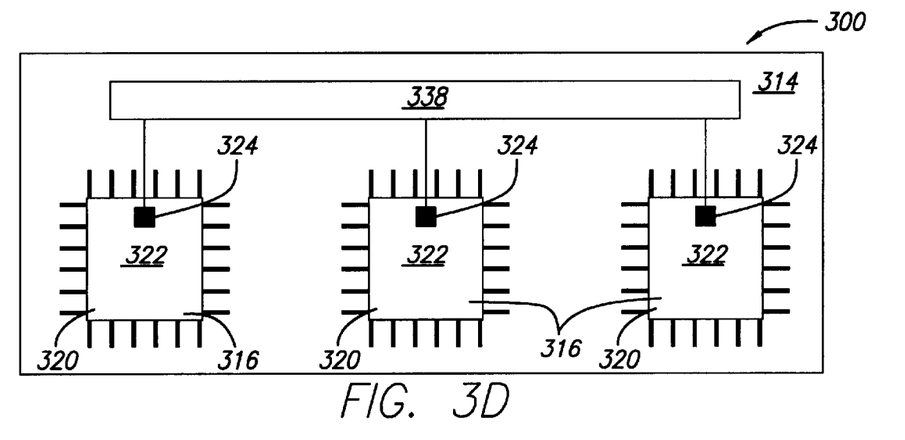

In an alternative embodiment shown in FIG. 3D, one or more packaged IC's 320 may include an RFID IC 324 integrated therein as described in the discussion of FIGS. 2A and 2B. For example, the RFID IC 324 may comprise a separate IC chip encapsulated within the package 322 adjacent to a host IC chip to form a multi-chip module (see FIG. 2A). The RFID IC chip may be electrically coupled to at least one of the leads 340 of the package (e.g., for connection of an external antenna, power, etc.). Preferably, the RFID IC 324 is electrically coupled to the host IC via conventional techniques such as wire bonding or the like. The RFID IC 324 may also operate separately from the host IC (e.g., the RFID IC is not electrically coupled to the host IC). Alternatively, the RFID IC 324 may comprise a circuit integrated monolithically within the host IC chip (see FIG. 2B). Specified leads 340 to which the host IC chip is coupled may be dedicated to coupling the RFID circuit to an antenna assembly 338.

Wherein more than one packaged IC 320 mounted to the circuit board 314 contains an RFID IC 324, the antenna assembly may include a separate antenna for each RFID IC 324. These antennas may be mutually coupled, or decoupled (e.g., independent) if sufficient space is provided between them on the circuit board. Alternatively, one or more of the RFID IC's 324 may share a common antenna. A switching network, which may be built into the antenna assembly 338, and a switch algorithm may be used to schedule usage of the antenna by the various RFID IC's 324.

Referring now to FIGS. 4A through 4F, application of the present invention at the device or "box" level is shown. An electronic device 400 such as a computer, network server, etc. may include a plurality of electronic components 412. The electronic components 412 are preferably configured to provide functions of the device 400. Typical electronic components 412 which may be contained in an electronic device in accordance with the present invention include, but are not limited to, circuit boards (shown in FIG. 4A through 4G), primary circuit cards or "motherboards" (shown in FIGS. 4B through 4G), power supplies, memory devices (i.e., a magnetic disk drive, an optical disc drive, etc.), ports, displays, and data entry devices (i.e., keyboards, keypads, pointing devices, etc.).

The electronic device 400 may include a means of interconnection (e.g., a primary circuit board or "motherboard") 430 to which other electronic components 412 (and various electronic elements, such as processors, memory IC's, etc.) may be mounted and electrically connected (FIGS. 4B through 4F). RFID transponders 414 & 420 may be useful during assembly, inventory, and delivery (including loading and receiving) of such electronic devices. For example, the RFID transponder may be programmed to contain the serial number, part number, and warranty information of the electronic device 400. Optionally, the RFID IC's memory may also contain part numbers, serial numbers, installation dates, warranty and information for components 412 contained within the device 400.

Figure 4A:
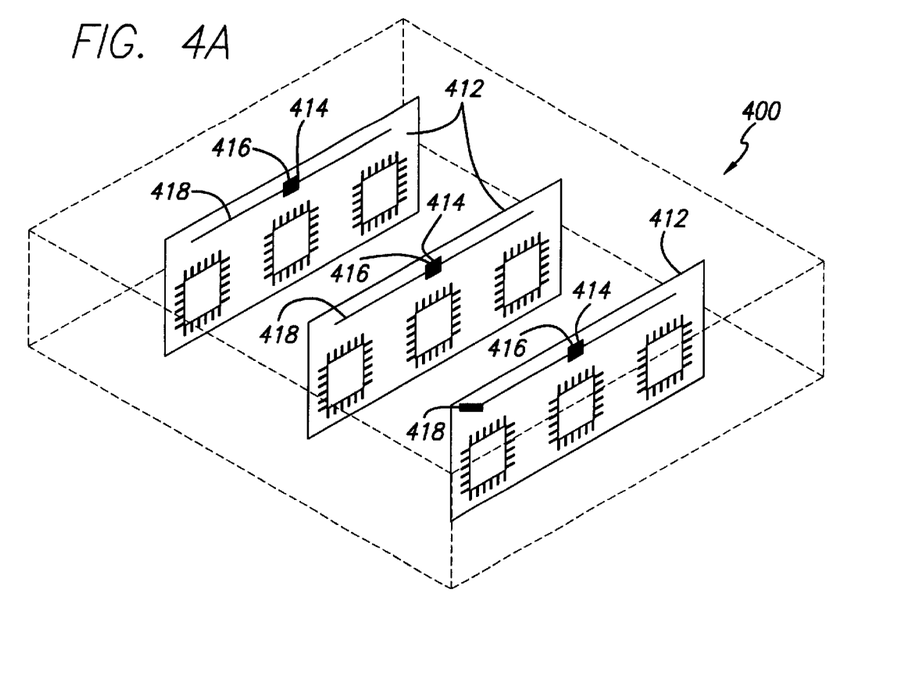
FIGS. 4A, 4B, 4C, 4D, and 4E are isometric views illustrating the application of the present invention at the device or "box" level.

Turning now to FIG. 4A, one or more of the electronic components 412 contained within the device 400 may include an RFID transponder 414. For example, for electronic components 412 comprising circuit boards 416 (shown) the RFID transponder 414 may be integrated within the circuit board 416 as described in the discussion of FIGS. 3A through 3D, supra. For other types of electronic components 412 (i.e., disc drives, power supplies, etc. not shown), the RFID transponder 414 may be attached to the component via a fastener such as an adhesive, rivets, screws, and the like. Alternatively, these components may include a circuit board having an integrated RFID transponder (see FIGS. 2A through 2D, supra).

The RFID transponder 414 of each RFID equipped electronic component 412 may include a radio frequency identification integrated circuit (RFID IC) 416 and antenna 418. The RFID IC 416 preferably comprises an RF processing section (e.g., a front end) and a signal processing section including logic circuits and memory for storing information. Each RFID transponder 414 may in this manner be programmed with information about the electronic device 400 and, optionally, the electronic components 412 within the device 400. This information may be transmitted to the RFID system (see FIG. 1) via an interrogator or base station using an antenna which probes the interior of the device's housing, or using an antenna placed outside of the housing which communicates with the RFID transponders 414 within the device 400 via a frequency selected surface (FSS). See U.S. Pat. No. 5,767,789 to Afzali-Ardakani et al., issued Jun. 16, 1998, which is herein incorporated by reference in its entirety.

Alternatively, as shown in FIGS. 4B through 4E, a single "device-level" RFID transponder 420 may be mounted within the housing 422 of the electronic device 400. The device-level RFID transponder 420 may function in place of or in conjunction with the circuit board mounted RFID transponders described in the discussion of FIG. 4A. Preferably, the device-level RFID transponder 420 is configured to communicate with an RFID system via the system's base unit or a handheld interrogator (see FIG. 1).

Figure 4B:
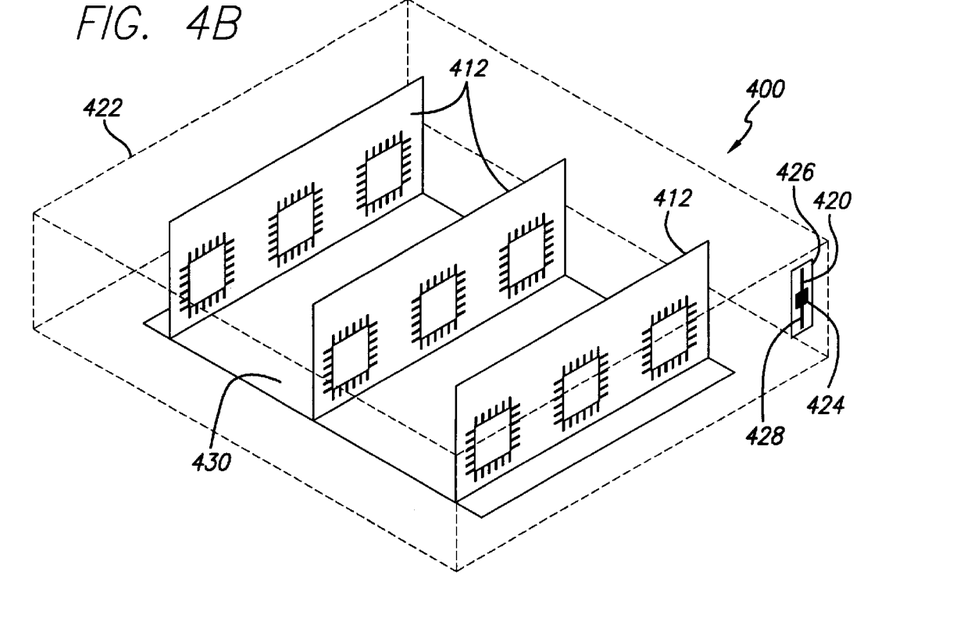

As shown in FIG. 4B, the RFID transponder 420 may be attached to an interior surface of the housing 422 via a fastener such as an adhesive, double sided tape, rivets, bolts, or the like. The RFID transponder 420 preferably includes a packaged radio frequency identification integrated circuit (RFID IC) 424 mounted to a substrate 426 and bonded to an antenna 428. Preferably, the RFID IC 424 comprises an RF processing section (e.g., a front end) and a signal processing section including logic circuits and memory for storing information. The RFID transponder 420 may be electrically interconnected to the motherboard 430 of the electronic device via a wire, cable, flexible circuit, or the like. In this manner, the RFID transponder 424 may be programmed with information about the electronic device 400 and, optionally, the electronic components 412 within the device 400. This information may be transmitted to the RFID system (see FIG. 1) via an interrogator or base station using an antenna which probes the interior of the device's housing, or using an antenna placed outside of the housing which communicates with the RFID transponders 420 within the device 400 via a frequency selected surface (FSS). See U.S. Pat. No. 5,767,789 to Afzali-Ardakani et al., supra.

Substrate materials on which the RFID IC 424 may be mounted include polyester, polyimide, ceramics, FR-4 epoxy, phenolic, and like dielectric materials. The packaged RFID IC 424 preferably comprises an RFID IC chip encapsulated within a plastic-molded package. The package may be a single in-line package (SIP), dual in-line package, or a flat pack. Typical flat pack IC packages which may be employed by the present invention include, but are not limited to SOC, MSOP, SOIC, PBGA, TQFP, LQFP, MQFP, PQFP, PLCC, TSSOP, SSOP, QSOP, MICRO, PDIP, and POWER packages. Preferably, the package includes a plurality of external leads or pins (not shown). Two of the leads may electrically couple the RFID IC 424 to the antenna 428 formed on the substrate 426 (i.e., the leads may be soldered to the antenna 428 using conventional soldering techniques). Alternatively, a non-packaged RFID IC chip (not shown) may be directly mounted to the substrate 426 and bonded to the antenna 428. The non-packaged RFID IC chip may be coated with an encapsulant, such as a "glob-top" epoxy, or the like and/or laminated with a laminate to protect the chip (and bonds between the antenna and chip) from damage.

The antenna 428 may be integrally formed on the substrate 426. Preferably, the antenna 428 comprises thin, typically 18 to 35 micron thick, lines formed of a conductive metal such as copper. These lines may be formed by plating, adhering or screening a thin layer of copper (or other conductive metal) onto to the substrate 426. This layer may then be etched to form the specific geometric configuration (i.e., monopole, dipole, folded dipole, meander dipole, patch, slot, loop, spiral, etc.) of the antenna 428. One or more impedance adjustment elements (see FIG. 3A) may be integrally formed on the substrate 426 to modify the impedance of the antenna 428. The impedance adjustment elements may be lumped circuit elements, distributed microwave circuit elements, or a parasitic element that is electromagnetically coupled to the antenna (i.e., not electrically connected).

Figure 4C:
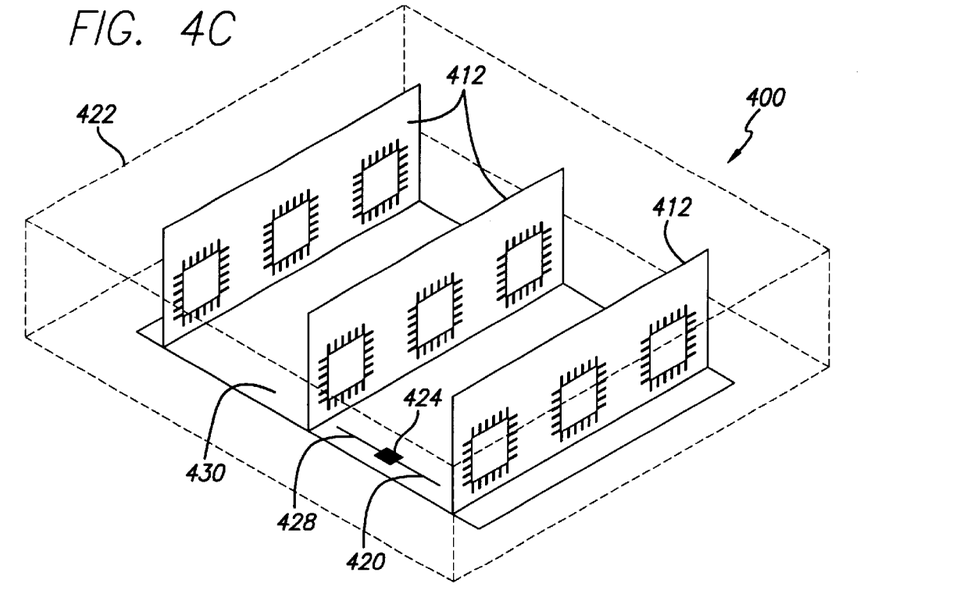

As shown in FIG. 4C, the RF transponder 420 including the RFID IC 424 and antenna 428 may alternatively be integrated on the motherboard 430. This may be accomplished by using the methods and apparatus for mounting an RFID transponder onto a printed circuit board as described in the discussion of FIGS. 3A through 3D, supra. Preferably, the RFID transponder 420 is electrically interconnected with other electronic elements and components 412 coupled to the motherboard 430. The RFID transponder 424 may be programmed with information about the electronic device 400 and, optionally, the electronic components 412 within the device 400. This information may be transmitted to the RFID system (see FIG. 1) via an interrogator or base station using an antenna which probes the interior of the device's housing, or using an antenna placed outside of the housing which communicates with the RFID transponders 414 within the device 400 via a frequency selected surface (FSS). See U.S. Pat. No. 5,767,789 to Afzali-Ardakani et al., supra.

Figure 4D:
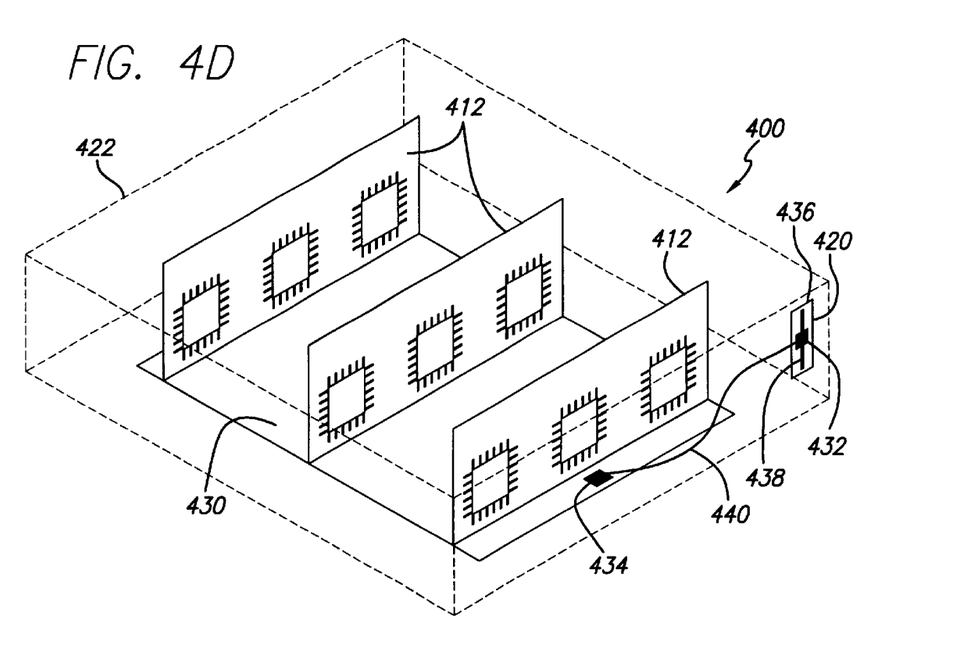

Turning now to FIG. 4D, an embodiment of the present invention is shown wherein the RF front-end 432 and antenna 438 of the RFID transponder 420 are mounted on the electronic device's housing 422 while the signal processing section 434 while other circuits of the RFID transponder 420 are mounted on the motherboard 430. The RF front-end 432 and the signal processing section 434 of the RFID transponder 420 may, for example, be separately packaged (i.e., in a single in-line package (SIP), dual in-line package, flat pack, etc.). The front-end 432 may be mounted to a circuit board or substrate 436 and interconnected with an antenna 438. The antenna 438 may be integrally formed on the substrate 436 (i.e., via etching, screening, etc.) or may be externally provided. The substrate 436 may be secured to the housing 422 via a fastener such as adhesive, rivets, screws, etc., or, alternatively, mounted separately from the motherboard 430 within the housing 422 and interconnected to the signal processing section 434 mounted to the motherboard 430 via a wire or cable 440.

Figure 4E:
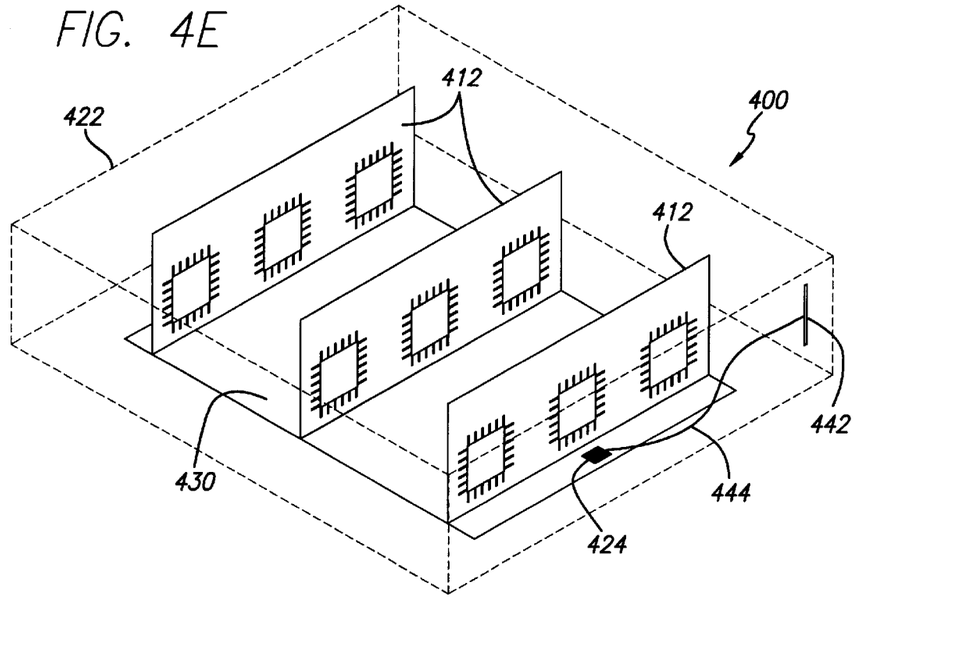
Figure 4F:
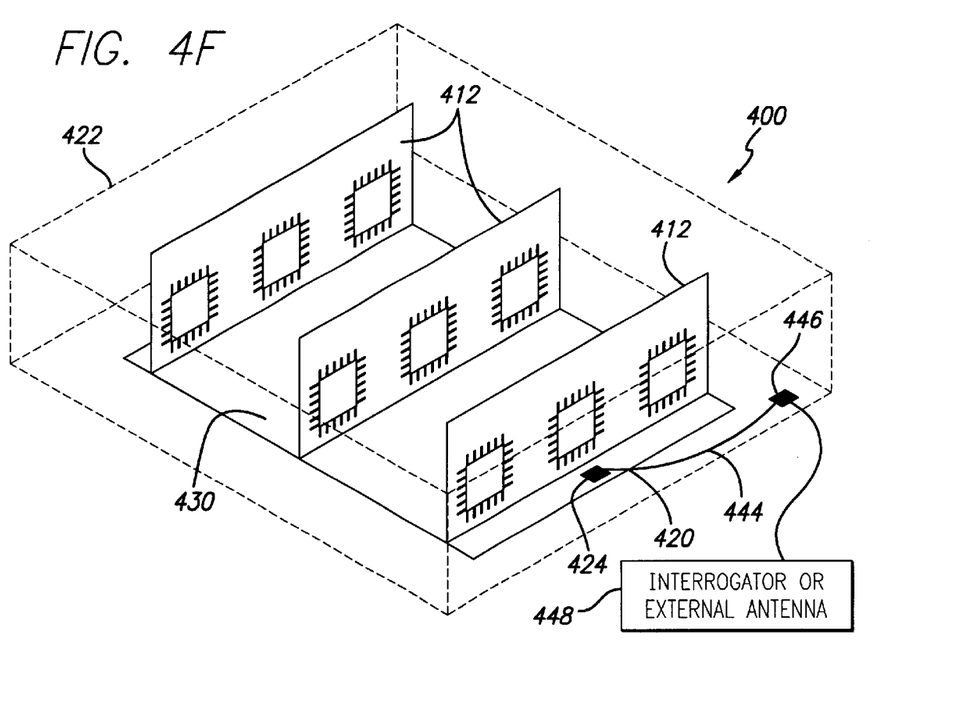
FIG. 4F depicts an electronic device wherein the RF transponder is coupled directly to an interrogator via a connector and cable.

As shown in FIGS. 4E and 4F, the RFID transponder 420 may have only its antenna 442 externally mounted, while its RFID IC 424 is mounted to the motherboard 430 of the electronic device 400. As shown in FIG. 4E, an RF cable (i.e., a coaxial cable) 444 may interconnect the RF front-end of the RFID IC 424 to an antenna 442 mounted to the device's housing 422. Alternatively, as shown in FIG. 4F, the RF cable 444 may interconnect the RF front-end to an RF connector (i.e., a coaxial cable connector) 446 mounted to the housing 422 of the electronic device 400. An interrogator or externally provided antenna 448 may be coupled to the connector 446 so that the RFID IC 424 may communicate information with the RFID system (see FIG. 1).

Figure 4G:
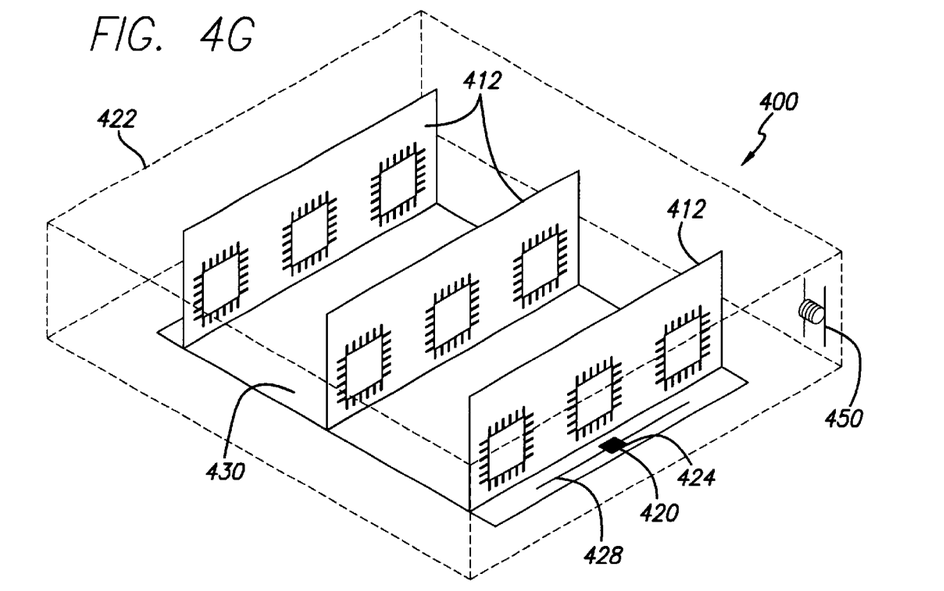
FIG. 4G depicts an electronic device comprising a primary circuit board or "motherboard," RF transponder, and dual antenna assembly.
Figure 4H:
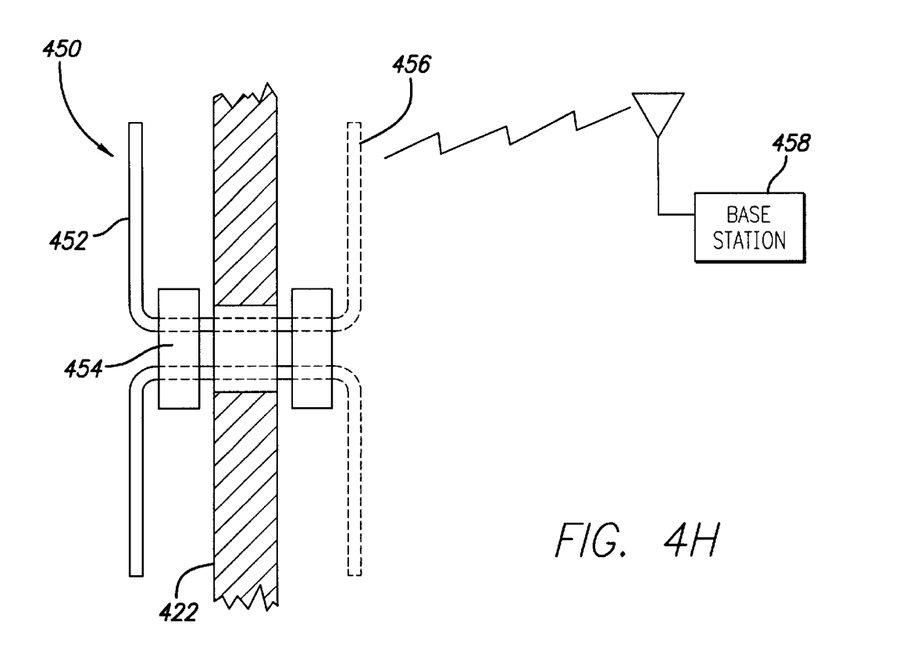
FIG. 4H is a cross-sectional side elevational view of the dual antenna assembly.

As shown in FIGS. 4G and 4H, one or more RF transponders 420 mounted within an electronic device 400 may communicate with an external base station or interrogator 458 of an RFID system (see FIG. 1) via a dual (internal/external) antenna assembly 450 mounted to the housing 422 of the device 400. As shown in FIG. 4G, an RF transponder 420 including the RFID IC 424 and antenna 428 may be integrated on the motherboard 430 as shown in FIG. 4C, supra, and described in the discussion thereof. Preferably, the external antenna 456 of the dual antenna assembly 450 receives the RF interrogation signal generated by the base station 458. The signal is conveyed to the internal antenna 452 and radiated to the antenna 428 of the RF transponder 420. Similarly, RF signals generated by RF transponder 420 may be received by the internal antenna 452, conveyed to the external antenna 456 and radiated to the base station 458.

As shown in FIG. 4H, the dual antenna assembly 450 preferably includes an external antenna (i.e., an externally provided antenna (shown), an antenna mounted to the outside of the housing 422, etc.) 456 located outside of the housing 422. The external antenna 456 is coupled to an internal antenna 452 which is mounted within the housing 422. A support 454 may extend through the housing 422 to support both the internal and external antennas 452 and 456. The support 454 may also provide a means (i.e., wires, cable, etc.) for coupling the antennas 452 and 456 to each other.

When electrically interconnected to the motherboard 430 of the electronic device 400, as shown in FIGS. 4B through 4H, the RFID transponder 420 may be capable of communicating with other electronic elements and components 412 also interconnected to the motherboard 430. In this manner, information about the elements and components 412 may be communicated to the RFID transponder 420 via the motherboard 430. The information may be written to the RFID transponder's memory and communicated to the RFID system when the RFID transponder 420 is interrogated. For example, wherein the electronic device 400 is computer having an open architecture, the RFID transponder 420 may be interconnected to the computer's processor, disc drives, hard disk drives, etc., via a system bus. The processor may cause information such as identification of components within the computer, status of components within the computer, configuration of the computer to be communicated to the RFID transponder 420 via the system bus and written to the RFID transponders memory. When the RFID transponder 420 is interrogated by the RFID system, for example, for testing of the computer or inventory of its components, the information is communicated by the motherboard-mounted RFID transponder. In this manner, the more powerful processing capability of motherboard mounted components (i.e., the computer's processor, memory, etc.) may be interrogated via the RFID link without establishing physical contact with the computer itself.

Further, RFID transponders 420 (or 114 FIG. 1) may provide anti-theft functions to prevent theft of the electronic device 400 or the components 412 and elements contained therein. An RFID system (see FIG. 1) may be utilized to prevent removal of the electronic device from the premises (i.e., factory, warehouse, office, etc.) where it is stored, or used. For example, an office employing a large number of advanced computer systems may utilize interrogators or base stations located near exits to warn if an RFID equipped electronic device 400 is being removed. Similarly, the electronic device 400 (or a specific component 412 or element contained therein) may be designed so that it will not function properly unless it is enabled or "activated" in the manufacturer's facility. In an exemplary embodiment, the device 400 may be activated by a base station which transmits an "unlock" command to the RF transponder 420 (or 114 FIG. 1). The unlock command may flip the state of a lock/unlock bit within the device's microprocessor or the RFID IC which controls the activities and operation of the device 400. Alternatively, sophisticated keyed encryption architectures may be used to secure the transactions between the authorizing base station and the RF transponder 420 (or 414 FIG. 1).

Figure 5A:
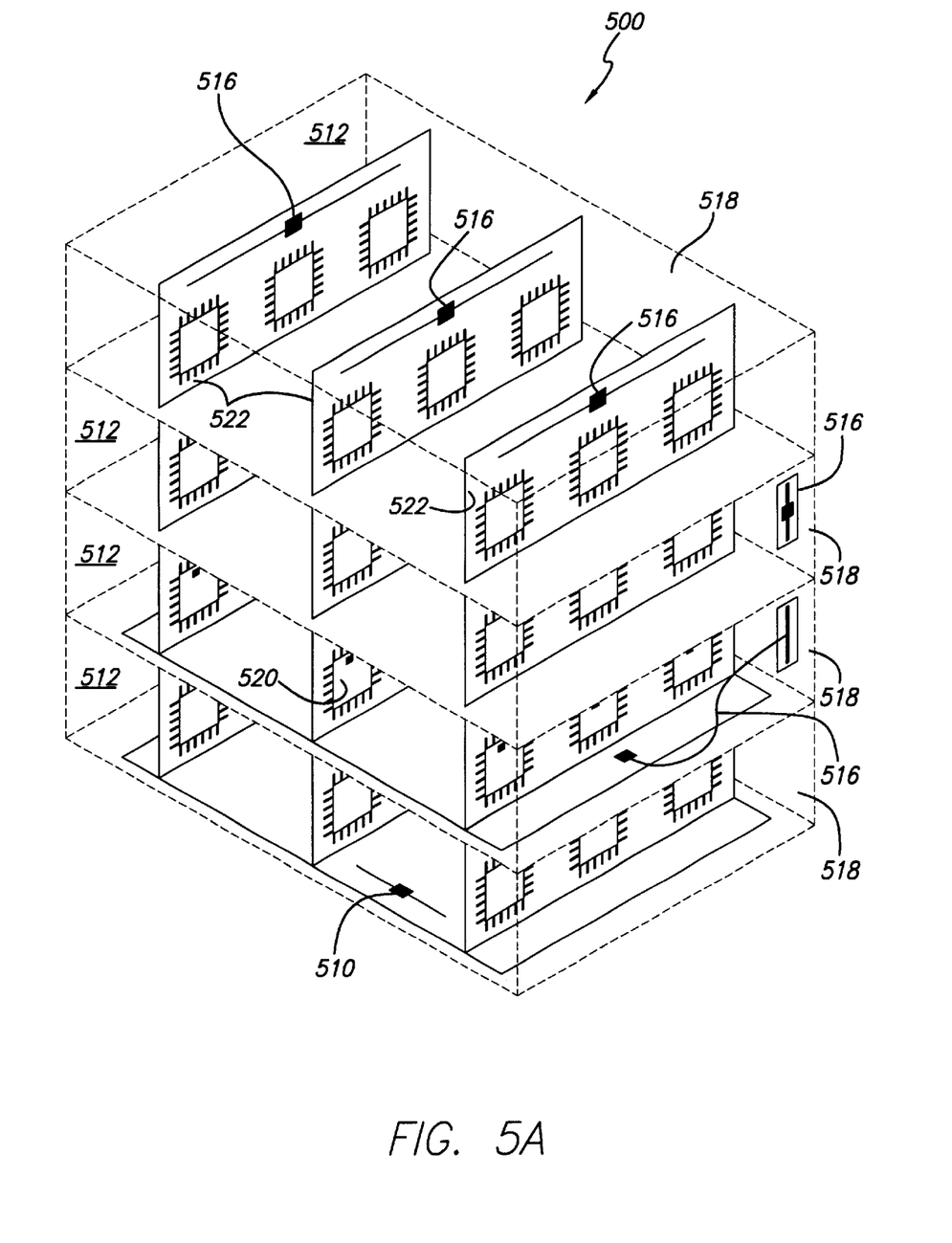
FIGS. 5A and 5B are isometric views illustrating the application of present invention at the system level.
Figure 5B:
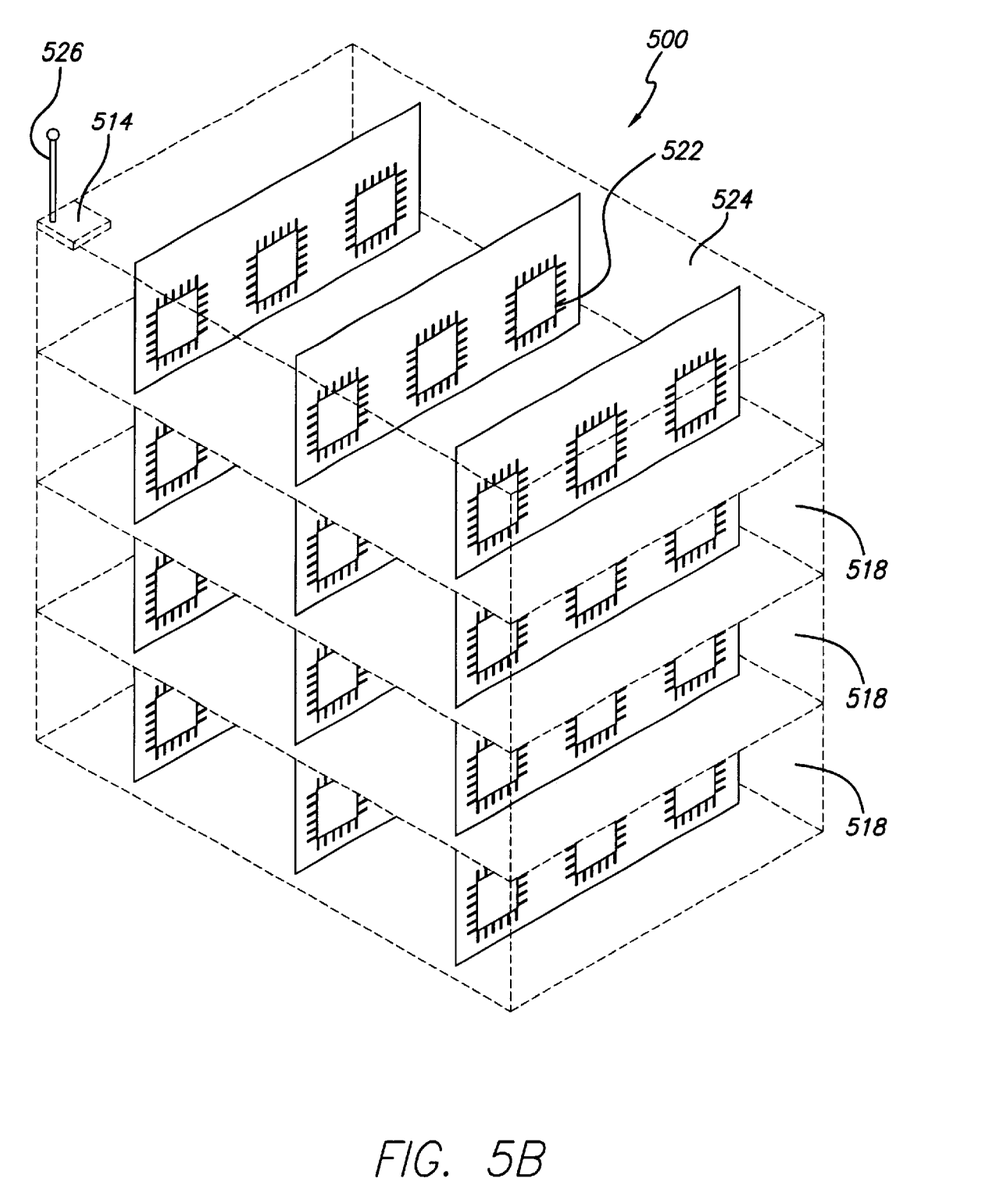

Referring now to FIGS. 5A and 5B, application of the present invention at the system level is shown. A typical system (i.e., an information handling system such as a personal computer server, a mini-computer system, a parallel computer system, a main frame system, a super computer system, etc.) 500 may include a plurality of electronic devices (servers, computers, terminals, printers, etc.) 512 each configured to provide functions of the system 500. RFID transponders 514 & 516 may be integrated into the system at the chip level (see FIGS. 2A and 2B), component level (see FIGS. 3A through 3D, device level (see FIGS. 4A through 4F), or system level (i.e., a single system level RFID transponder 514, see FIG. 5B).

As shown in FIG. 5A, for example, RFID transponders 516 may be incorporated into at least one of the system's electronic devices or boxes 518. Preferably, the RFID transponders 516 may be integrated within each of the devices 518 utilizing any of the methods and apparatus shown in or described in connection with FIGS. 1A through 4G. Each of the RFID transponders 516 may include information about the system 500 and, optionally, information about the particular element 520 (i.e., integrated circuit (IC), see FIGS. 2A and 2B), component 522 (i.e., circuit board, see FIGS. 3A through 3D), or device 518 (see FIGS. 4A through 4G) in which it is contained. Further, wherein RFID transponders 516 are incorporated in each device 518 of the system 500 and are interconnected with elements 520 and components 522 of the device 518 in which they are incorporated (see FIGS. 3C, 3D, and 4C), the RFID transponders 516 may provide short-distance low-data-rate wireless communications among the system devices 518. This capability is useful not only for conventional RFID purposes, but also for an additional function—calibrating propagation delay of timing signals—because the propagation delay of electromagnetic wave in air is known (the speed of light).

Turning now to FIG. 5B, a single system level RFID transponder 514 may be provided. This RFID transponder 514 may be mounted to a primary device 524 (i.e., a server, a mainframe computer, etc.) of the system 500, or, alternatively, to a system rack, frame, or cabinet (not shown). Preferably, the system level RF transponder 514 includes a signal processing section. The signal processing may include memory for storing information, an RF front end for providing communication of the information with the RFID system, and an antenna 526 coupled to the RF front end. The RF transponder 514 may be communicatively coupled (i.e., via a system bus) to each device 518 within the system 500 so that it may be provided with information about the system 500, devices within the system 518 & 524, and elements 520 and components 522 of each device 518 & 524. The RF transponder 514 may also communicate with other device, component, and/or element level RF transponders via wireless RF communication. In this manner, information about the elements 520, components 522, and devices 518 & 524 may be communicated to the system RFID transponder 514. The information may be written to the RFID transponder's memory (or stored in separate memory within a system device 518 & 524) and communicated to the RFID system when the RFID transponder 514 is interrogated. The RFID transponder 514 may be interrogated to provide information such as identification of devices and components within the system, status of devices within the system, configuration of the system, etc. for testing of the system or inventory of its components.

Further, the RFID transponders 514 may provide anti-theft functions to prevent theft of electronic devices 518 and/or components 522 and elements 520 contained therein. The system RF transponder 514 may be utilized to detect unauthorized removal of electronic devices 518 (or components 522 and elements 520) from the system 500 (via RF communication with device, component, and/or element level RF transponders). Similarly, electronic devices 518 (or a specific component 522 or element 520 contained therein) may be designed so that they will not function properly unless enabled or "activated" by the system RF transponder 514.

In any of the foregoing embodiments described herein, the RF transponder may be "active" meaning that the transponder includes an internal transmitter or transceiver for transmitting information to the interrogator or base station (not shown), or "passive" meaning that the transponder uses a modulated back scattered RF field (generated by the interrogator or base station) to provide a return signal to provide the information. Further, the RF transponder may be field powered, or alternatively, may be at least partially battery powered. Field powered transponders collect power from the RF field generated by the interrogator or base station and convert the collected power to a dc voltage which is stored in a capacitor to provide power for operating the transponder's other circuitry. Battery powered transponders may employ an external battery which may be mounted to the circuit card which may be electrically coupled to the RFID IC via one or more of the package leads.

Various modifications may be made in and to the above described embodiment without departing from the spirit and scope of the invention. For example, various modifications and changes may be made in the configuration of the RF transponder such as reconfiguration of the antenna geometry, battery arrangement, circuit chip construction, substrate material and geometry, and the like.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An electronic component having an integrated RF transponder for communicating information about the component to an RFID system, said electronic component comprising:

a substrate;

a plurality of packaged integrated circuits each configured to provide a function of the electronic component wherein at least two of said packaged integrated circuits include an RF transponder circuit, said RF transponder circuit containing memory for storing information about the electronic component and an RF transmitter and receiver section for communicating the information to the RFID system.

2. The electronic component of claim 1, further comprising at least two antennas formed on said substrate, wherein each antenna is coupled to a different RF transponder circuit.

3. The electronic component of claim 1, further comprising a single antenna coupled to each of the at least two RF transponder circuits so that the antenna is shared.

4. An electronic device capable of communicating information to an RFID system, said electronic device comprising:

an electronic component configured to provide a function of the electronic device, the electronic component further comprising a printed circuit board including a substrate; and an RF transponder mounted to said substrate within the electronic device, said RF transponder including an RF transmitter and receiver section for communicating the information to the RFID system, said RF transponder further including an antenna formed on the substrate; and a dual antenna assembly including an internal antenna mounted within the housing and an external antenna mounted outside the housing, the internal antenna coupled to the external antenna for conveying RF signals between said RF transponder and the RFID system.

5. An electronic device capable of communicating information to an RFID system, said electronic device comprising:

an electronic component configured to provide a function of the electronic device;

a housing enclosing said electronic component;

an RF transponder mounted within the electronic device, said RF transponder including an RF transmitter and receiver section for communicating the information to the RFID system, and wherein the electronic component comprises a printed circuit board including a substrate and wherein at least part of the RF transponder is mounted to the substrate, and wherein the RF transponder includes a radio frequency identification integrated circuit (RFID IC) comprising a signal processing section mounted to the substrate and an RF front end mounted on the housing and coupled to an antenna.

6. The electronic device of claim 5, wherein the antenna is mounted to the housing.

7. The electronic device of claim 5, wherein the antenna is an externally provided antenna.

* * * * *